(12) United States Patent
Sakao

(10) Patent No.: US 6,387,752 B1
(45) Date of Patent: May 14, 2002

(54) SEMICONDUCTOR MEMORY DEVICE AND METHOD OF FABRICATING THE SAME

(75) Inventor: Masato Sakao, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/329,400

(22) Filed: Jun. 10, 1999

(30) Foreign Application Priority Data

Jun. 12, 1998 (JP) .......................................... 10-164500

(51) Int. Cl.$^7$ ..................... H01L 21/8242; H01L 21/20; H01L 21/44; H01L 21/302

(52) U.S. Cl. ....................... 438/253; 438/396; 438/640; 438/978; 438/726

(58) Field of Search ................................ 438/253, 396, 438/398, 640, 978, 240, 241, 239, 397, 254, 703, 720, 723, 756, 754

(56) References Cited

U.S. PATENT DOCUMENTS

| | | | | |
|---|---|---|---|---|
| 5,346,844 A | * | 9/1994 | Cho et al. | 438/253 |
| 5,580,811 A | * | 12/1996 | Kim | 438/253 |
| 5,661,065 A | * | 8/1997 | Koga | 438/253 |
| 5,668,039 A | * | 9/1997 | Lin | 438/387 |
| 5,726,086 A | * | 3/1998 | Wu | 438/253 |
| 5,851,877 A | * | 12/1998 | Ho et al. | 438/253 |
| 5,874,335 A | * | 2/1999 | Jeng et al. | 438/253 |
| 5,888,862 A | * | 3/1999 | Yamazaki | 438/238 |
| 5,891,768 A | * | 4/1999 | Figura et al. | 438/253 |
| 5,902,126 A | * | 5/1999 | Hong et al. | 438/396 |
| 5,930,621 A | * | 7/1999 | Kang et al. | 438/253 |
| 5,946,566 A | * | 8/1999 | Choi | 438/239 |
| 5,946,571 A | * | 8/1999 | Hsue et al. | 438/255 |
| 5,960,293 A | * | 9/1999 | Hong et al. | 438/397 |
| 6,001,682 A | * | 12/1999 | Chien | 438/239 |
| 6,063,548 A | * | 5/2000 | Chu | 430/314 |
| 6,107,136 A | * | 8/2000 | Melnick et al. | 438/253 |

FOREIGN PATENT DOCUMENTS

| | | | |
|---|---|---|---|
| EP | 0282716 A1 | * | 9/1988 |
| JP | 404304666 A | * | 10/1992 |
| JP | 405183123 A | * | 7/1993 |
| JP | 405190862 A | * | 7/1993 |
| JP | 5-218332 | | 8/1993 |
| JP | 405259395 A | * | 10/1993 |
| JP | 406085186 A | * | 3/1994 |
| JP | 6-151747 | | 5/1994 |

(List continued on next page.)

*Primary Examiner*—Caridad Everhart
*Assistant Examiner*—Chuong Anh Luu
(74) *Attorney, Agent, or Firm*—Scully, Scott, Murphy & Presser

(57) ABSTRACT

There is provided a method of fabricating a semiconductor memory device including a memory cell having transistor and a capacitor, and a cylindrical accumulation electrode, the method including the steps of (a) forming a first insulating film on a lower interlayer insulating film, (b) forming at least one hole through the first insulating film so that the hole reaches the lower interlayer insulating film, (c) forming a polysilicon layer in the hole so that an upper surface of the polysilicon layer is located lower than an upper surface of the first insulating film, (d) covering the first insulating film and the polysilicon layer with a second insulating film, (e) etching back the second insulating film so that the second insulating film remains only on a sidewall of the first insulating film, and (f) etching the polysilicon layer with the second insulating film being used as a mask so that the polysilicon layer has a thickness different from a thickness of the first insulating film after the polysilicon layer has been etched. The method makes it possible to independently determine thicknesses of a sidewall and a bottom of a cylindrical accumulation electrode, and hence, design the bottom to have a greater thickness than a thickness of the sidewall. This ensures less risk of fall-down of the sidewall of the cylindrical accumulation electrode, higher structural stability, and higher capacity of the cylindrical accumulation electrode.

7 Claims, 7 Drawing Sheets

FOREIGN PATENT DOCUMENTS

| | | |
|---|---|---|
| JP | 8-153858 | 6/1996 |
| JP | 8-306879 | 11/1996 |
| JP | 8-316435 | 11/1996 |
| JP | 8-330539 | 12/1996 |
| JP | 9-36331 | 2/1997 |
| JP | 9-232539 | 9/1997 |
| JP | 9-260605 | 10/1997 |
| JP | 10-22473 | 1/1998 |
| JP | 10-50955 | 2/1998 |
| JP | 10-92935 | 4/1998 |
| JP | 10-144881 | 5/1998 |

* cited by examiner

SEMICONDUCTOR MEMORY DEVICE AND METHOD OF FABRICATING THE SAME

BACKGROUND OF THE INVENTION

1. Field of the Invention

The invention relates to a semiconductor memory device and a method of fabricating the same, and more particularly to a semiconductor memory device having a cylindrical accumulation electrode and a method of fabricating the same.

2. Description of the Related Art

Among memory cells used for a highly integrated semiconductor memory or DRAM, a memory cell comprised of a single transistor and a single capacitor has the small number of constituents and can be readily reduced in an area, and hence, has been widely employed.

Since an output voltage produced by a memory cell is in proportion to a capacity of a capacitor included in a memory cell, it would be necessary for the capacitor to have a sufficient capacity in order to ensure stable operation of the memory cell, even when the memory cell is designed to be small-sized and highly integrated. As a capacitor designed to have a sufficiently great capacity is known a capacitor including a cylindrical accumulation electrode.

For instance, such a capacitor including a cylindrical accumulation electrode is disclosed in Japanese Unexamined Patent Publications Nos. 5-218332, 6-151747, 8-153858, and 8-316435.

FIGS. 1 to 4 are cross-sectional views of a memory cell including a cylindrical accumulation electrode, illustrating respective steps of a method of fabricating a cylindrical accumulation electrode, disclosed in the above-mentioned Japanese Unexamined Patent Publication No. 5-218332.

The method of a fabricating a cylindrical accumulation electrode is explained hereinbelow with reference to FIGS. 1 to 4.

First, as illustrated in FIG. 1, a transistor and a capacitor is fabricated on a semiconductor substrate 10 in accordance with a conventional method of fabricating a semiconductor device. At this stage, a resultant semiconductor device is covered at a surface thereof with a lower interlayer insulating film 11.

Then, a nitride film 12 and an oxide film 13 are successively deposited on the lower interlayer insulating film 11. The nitride film 12 and the oxide film 13 cooperate with each other to thereby form an insulating film 14. Then, as illustrated in FIG. 2, openings 15 are formed throughout the insulating film 14 in areas where accumulation electrodes are to be fabricated. The openings 15 reach the lower interlayer insulating film 11.

Then, as illustrated in FIG. 3, a thin polysilicon film 16 is formed on an inner sidewall and a bottom of each of the openings 15. The thin polysilicon film 16 is designed to have such a thickness that the thickness is sufficient as a sidewall of a cylindrical accumulation electrode and that the openings 15 are not filled with the polysilicon film 16. By designing the polysilicon film 16 to have such a thickness, there are formed recesses 16a surrounded by the polysilicon film 16.

Then, as illustrated in FIG. 3, the recesses 16a are filled with oxide films 17.

Then, a portion 16b (illustrated with broken lines) of the polysilicon film 16 formed on the oxide film 13 is etched back by dry etching for removal. Thereafter, the oxide film 13 is removed by etching.

Thus, there is obtained a cylindrical accumulation electrode 18. Then, as illustrated in FIG. 4, the cylindrical accumulation electrode 18 is entirely covered with a capacity plate or an opposing electrode 19. In the thus fabricated cylindrical accumulation electrode 18, a capacity C is defined by the capacity plate 19 and an outer surface 20 of a sidewall of the cylindrical accumulation electrode 18, acting as a capacity film.

In accordance with the cylindrical accumulation electrode 18, an outer surface and an inner surface of a cylinder are effective areas for defining a capacity C. Hence, a capacity C could be increased relatively to an accumulation electrode in the form of a rectangular parallelopiped block.

However, the conventional cylindrical accumulation electrode 18 is accompanied with a problem of structural stability in a sidewall of a cylinder. That is, the sidewall of the cylinder might be fallen down in a process carried out subsequent to the formation of the cylinder. Such structural instability of the cylinder is a hindrance to smoothly carrying out a process of fabricating a semiconductor memory device.

To the contrary, if the cylindrical accumulation electrode 18 is designed to have a sidewall having a great thickness for ensuring structural stability, there would be paused another problem that an area defined within an inner surface of a sidewall of the cylinder cannot avoid from being small, resulting in a smaller capacity.

The reason why the above-mentioned problems are caused is that the conventional cylindrical accumulation electrode 18 is designed to have a sidewall and a bottom which have the same thickness. Specifically, since the polysilicon film 16 is formed in the opening 15 in a single step in the conventional method of fabricating the cylindrical accumulation electrode 18, a thickness of a sidewall of the cylinder is unavoidably always the same as a thickness of a bottom of the cylinder.

As a result, when an area of a memory cell is to be reduced, a thickness of a sidewall of the cylinder had to be reduced in the conventional cylindrical accumulation electrode so that opposing portions of a sidewall do not make contact with each other. Since a thickness of a sidewall is always equal to a thickness of a bottom in the conventional cylindrical accumulation electrode, if a thickness of a sidewall is reduced, a thickness of a bottom is also reduced, resulting in structural instability of a cylindrical accumulation electrode.

In particular, since a thickness of a portion through which a sidewall is connected to a bottom is also reduced, the sidewall is likely to fall down from the bottom at the portion.

SUMMARY OF THE INVENTION

In view of the above-mentioned problems in the conventional cylindrical accumulation electrode, it is an object of the present invention to provide a semiconductor memory device and a method of fabricating the same, both of which are capable of independently determining thicknesses of a sidewall and a bottom of a cylindrical accumulation electrode, and differentiating the thicknesses from each other.

In one aspect of the present invention, there is provided a semiconductor memory device including (a) a memory cell including a transistor and a capacitor, and (b) a cylindrical accumulation electrode constituted of a sidewall and a bottom, a first thickness of the sidewall and a second thickness of the bottom of the cylindrical accumulation electrode being different from each other.

There is further provided a semiconductor memory device including (a) a memory cell including a transistor and a capacitor, and (b) a cylindrical accumulation electrode constituted of a sidewall and a bottom, a first thickness of the sidewall being smaller than a second thickness of the bottom.

In the semiconductor memory device, a bottom of a cylindrical accumulation electrode is designed to have a greater thickness than a thickness of a sidewall of the cylindrical accumulation electrode. This ensures much reduction in probability in fall-down of a sidewall, and enhances structural stability in a sidewall of a cylindrical accumulation electrode. In addition, it would be possible to accomplish a semiconductor memory device capable of readily increasing a capacity thereof.

The reason why a bottom of a cylindrical accumulation electrode can have a greater thickness than a thickness of a sidewall of the cylindrical accumulation electrode is that a bottom and a sidewall of a cylindrical accumulation electrode are independently formed in accordance with the present invention, and hence, thicknesses of a bottom and a sidewall can be independently determined, unlike the conventional cylindrical accumulation electrode.

It is preferable that the first thickness is greater at a location closer to the bottom. Namely, a sidewall of the cylindrical accumulation electrode may be tapered. For instance, the sidewall has a straight outer surface and a tapered inner surface.

By designing the first thickness in the above-mentioned manner, a thickness at a lowermost portion of the sidewall is maximum. Hence, it is possible to make a portion through which the sidewall is connected to the bottom greater in size, and hence, increase strength of a connection between the sidewall and the bottom. As a result, it is possible to eliminate structural instability in a cylinder by which the sidewall may be fallen down at a portion through which the sidewall is connected to the bottom.

It is preferable that an outer surface of the sidewall is entirely exposed to a capacity plate formed around the sidewall.

In comparison with a structure in which a second insulating film remains on the lower interlayer insulating film, it is possible to increase an area of an outer surface of the sidewall, as a capacity film, ensuring an increase in a capacity.

In another aspect of the present invention, there is provided a method of fabricating a semiconductor memory device including a memory cell having transistor and a capacitor, and a cylindrical accumulation electrode, the method including the steps of (a) forming a first insulating film on a lower interlayer insulating film, (b) forming at least one hole through the first insulating film so that the hole reaches the lower interlayer insulating film, (c) forming a polysilicon layer in the hole so that an upper surface of the polysilicon layer is located lower than an upper surface of the first insulating film, (d) covering the first insulating film and the polysilicon layer with a second insulating film, (e) etching back the second insulating film so that the second insulating film remains only on a sidewall of the first insulating film, and (f) etching the polysilicon layer with the second insulating film being used as a mask so that the polysilicon layer has a thickness different from a thickness of the second insulating film after the polysilicon layer has been etched.

In accordance with the above-mentioned method, a thickness of a sidewall of the cylindrical accumulation electrode is dependent on a thickness of the second insulating film having remained on an inner surface of the first insulating film. A thickness of a bottom of the cylindrical accumulation electrode is dependent on a condition for etching the polysilicon layer. Thus, the thicknesses of the sidewall and the bottom in the cylindrical accumulation electrode are determined in accordance with different factors, and hence, a thickness of the sidewall is not always equal to a thickness of the bottom unlike the conventional cylindrical accumulation electrode. It is possible to independently determine thicknesses of the sidewall and the bottom of the cylindrical accumulation electrode.

It is preferable that the polysilicon layer is etched in the step (f) so that the polysilicon layer has a thickness greater than a thickness of the second insulating film after the polysilicon layer has been etched.

By designing the bottom to have a greater thickness than a thickness of the sidewall, much reduction in probability in fall-down of a sidewall is ensured, and structural stability in a sidewall of a cylindrical accumulation electrode is enhanced. In addition, it would be possible to accomplish a semiconductor memory device capable of readily increasing a capacity thereof.

For instance, the step (c) may be designed to include the steps of (c1) filling the hole with polysilicon, and (c2) etching back the polysilicon so that an upper surface of the polysilicon is located lower than an upper surface of the first insulating film.

The simplest condition for etching the polysilicon is to control time for etching the polysilicon such that the polysilicon has a thickness greater than a thickness of the second insulating film after the polysilicon has been etched.

It is preferable that the polysilicon is etched to have such a taper that a thickness of the polysilicon is greater at a location closer to a bottom thereof.

For instance, the polysilicon may be etched so that the polysilicon has a straight outer surface and a tapered inner surface.

By designing a thickness of the polysilicon in the above-mentioned manner, a thickness at a lowermost portion of the sidewall is maximum. Hence, it is possible to make a portion through which the sidewall is connected to the bottom greater in size, and hence, increase strength of a connection between the sidewall and the bottom. As a result, it is possible to eliminate structural instability in a cylinder by which the sidewall may be fallen down at a portion through which the sidewall is connected to the bottom.

It is preferable that the method further includes the step of removing the first insulating film so that the lower interlayer insulating film entirely appears.

In comparison with a structure in which an insulating film remains on the lower interlayer insulating film, it is possible to increase an area of an outer surface of the sidewall, as a capacity film, ensuring an increase in a capacity.

The advantages obtained by the aforementioned present invention will be described hereinbelow.

When an area of a memory cell is to be reduced, a sidewall of a cylinder in a cylindrical accumulation electrode has to be designed to have a smaller thickness in order to prevent reduction in both an inner diameter of a cylinder and a capacity, and further to prevent opposing portions of a cylinder from making contact with each other to thereby prevent an inner surface of the cylinder from not acting as an area for defining a capacity.

In accordance with the present invention, it is possible to independently determine thicknesses of a sidewall and a bottom of a cylindrical accumulation electrode, and hence, design the bottom to have a greater thickness than a thickness of the sidewall. This ensures less risk of fall-down of the sidewall of the cylindrical accumulation electrode, higher structural stability, and higher capacity of the cylindrical accumulation electrode.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

Figure 12:
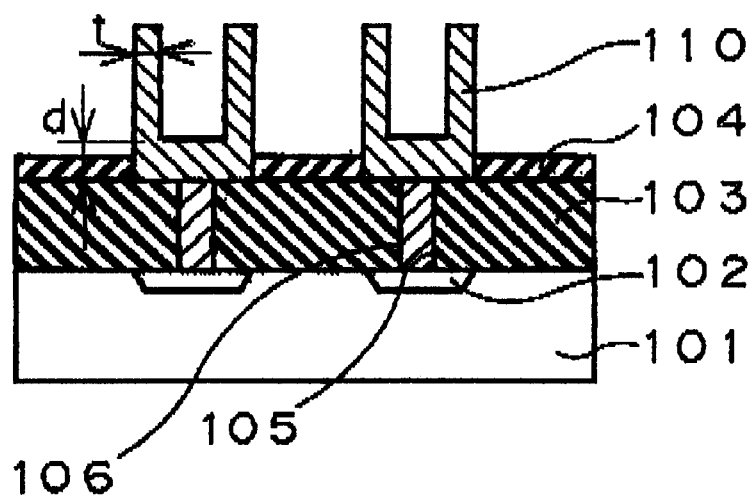

FIG. 12 is a cross-sectional view of a semiconductor memory device in accordance with the embodiment of the present invention. For simplification, a switching transistor, a bit line, and others constituting a memory cell are all omitted, and only one of source/drain regions, electrically connected to an accumulation electrode, is illustrated.

The semiconductor memory device in accordance with the embodiment is comprised of a p-type silicon substrate 101, source/drain regions 102 formed at a surface of the p-type silicon substrate 101, a lower interlayer insulating film 103 formed on the p-type silicon substrate 101, polysilicon plugs 106 filling therewith contact holes 105 formed throughout the lower interlayer insulating film 103, cylindrical accumulation electrodes 110 formed on the lower interlayer insulating film 103 in such a manner that the cylindrical accumulation electrodes 110 make contact with the polysilicon plugs 106, and a silicon nitride film 104 formed on the lower interlayer insulating film 103 around the cylindrical accumulation electrodes 103.

The cylindrical accumulation electrode 110 makes electrical contact with the source/drain regions 102 through the polysilicon plugs 106. A bottom of the cylindrical accumulation electrode 110 has a thickness "d" which is greater than a thickness "t" of a sidewall of the cylindrical accumulation electrode 110.

By designing the thickness "d" of the bottom to be greater than the thickness "t" of the sidewall in the cylindrical accumulation electrode 110, it is possible to reduce probability of fall-down of the sidewall.

Figure 14:
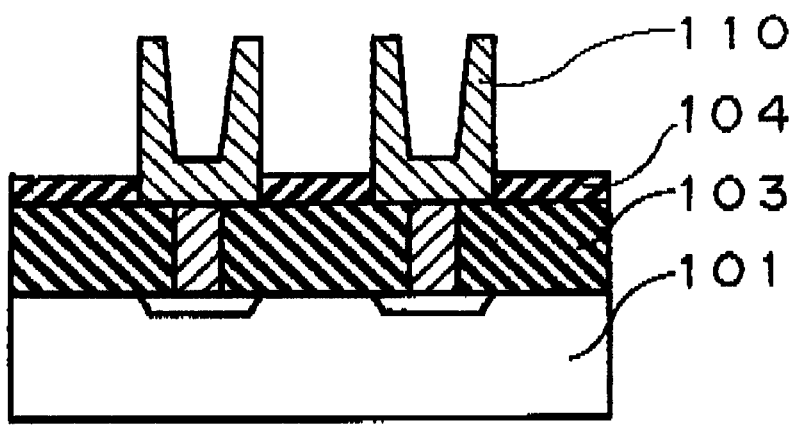
FIG. 14 is a cross-sectional view of a semiconductor memory device in accordance with a variant of the embodiment of the present invention.

As an alternative, as illustrated in FIG. 14, the sidewall of the cylindrical accumulation electrode 110 may be designed to tapered or have a thickness varying in line with a height thereof. Specifically, the thickness of the sidewall may be greater at a location closer to the lower interlayer insulating film 103.

By designing the sidewall to have such a tapered thickness as illustrated in FIG. 14, it is possible to increase an area of a portion through which the sidewall and the bottom are connected to each other, and hence, increase a connection strength between the sidewall and the bottom of the cylinder. This ensures that the sidewall is not fallen down at a portion through which the sidewall and the bottom are connected to each other.

Figure 15:
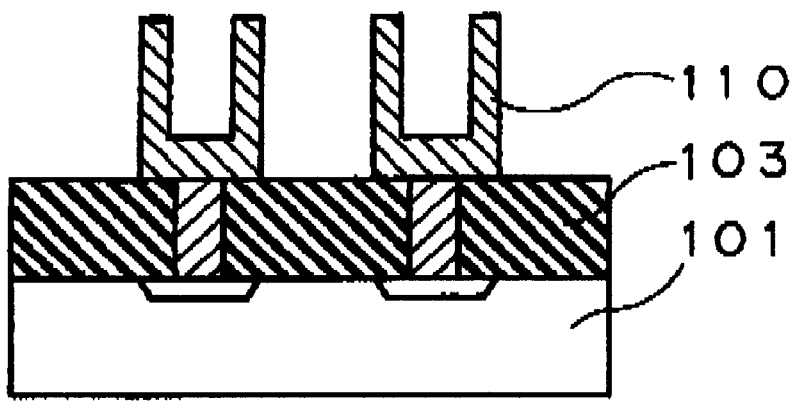
FIG. 15 is a cross-sectional view of a semiconductor memory device in accordance with another variant of the embodiment of the present invention.

The silicon nitride film 104 formed on the lower interlayer insulating film 103 may be entirely removed. That is, an outer surface of the sidewall of the cylindrical accumulation electrode 110 may be entirely exposed to a capacity plate to be formed around the sidewall, as illustrated in FIG. 15.

This configuration ensures that an area of exposed outer surface of the sidewall, acting as a capacity film, is increased, resulting in an increase in a capacity of the semiconductor memory device.

A method of fabricating a semiconductor memory device including the above-mentioned cylindrical accumulation electrode 110 is explained hereinbelow.

Figure 1:
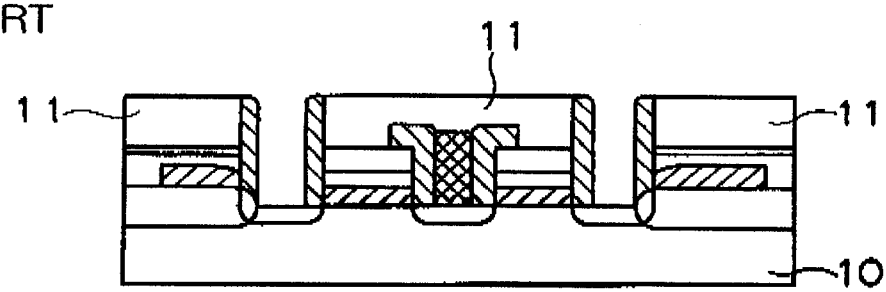
FIGS. 1 to 4 are cross-sectional views of a semiconductor memory device, illustrating respective steps of a conventional method of fabricating a semiconductor memory device.
Figure 2:
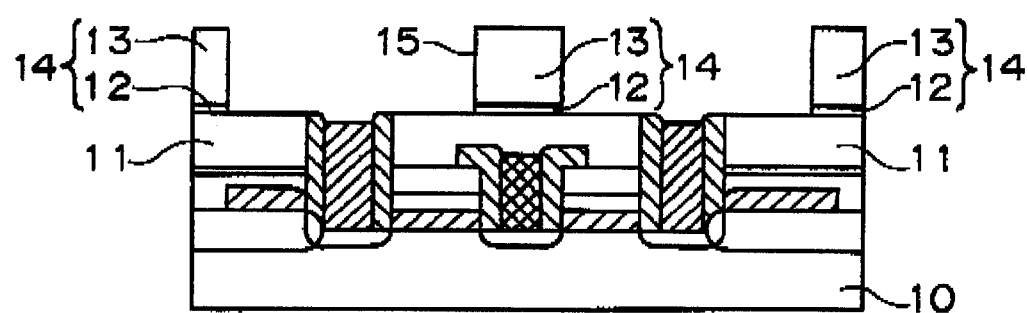
Figure 3:
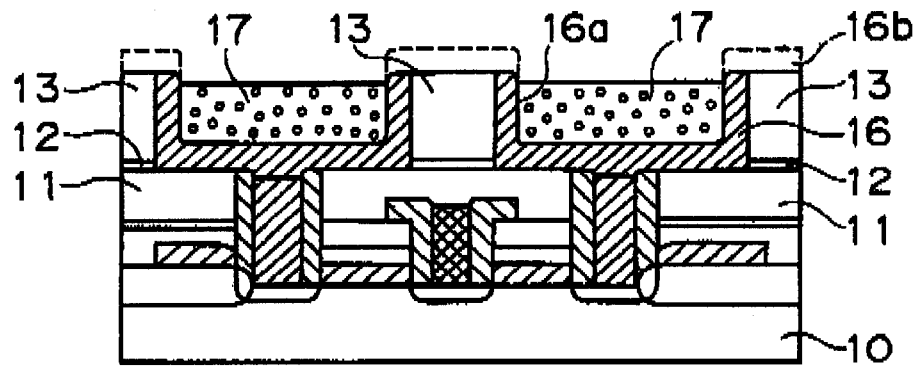
Figure 4:
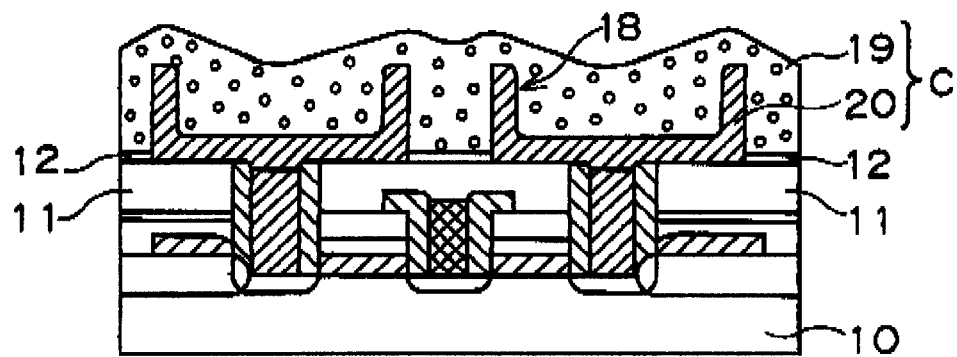
Figure 5:
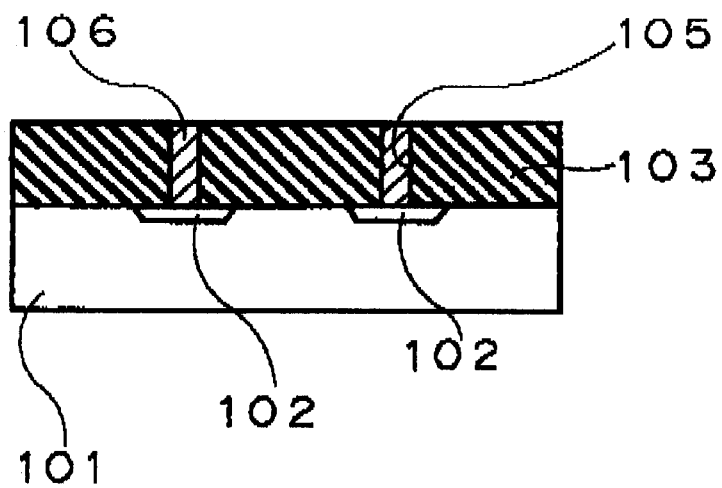
FIGS. 5 to 13 are cross-sectional views of a semiconductor memory device, illustrating respective steps of a method of fabricating a semiconductor memory device, in accordance with a preferred embodiment of the present invention.

First, as illustrated in FIG. 5, n-type impurity is implanted into the p-type silicon substrate 101 to thereby form source/drain regions 102.

Then, a silicon dioxide film as the lower interlayer insulating film 103 is deposited on the p-type silicon substrate 101 by chemical vapor deposition (CVD).

Then, the contact holes 105 are formed throughout the lower interlayer insulating film 103 by photolithography and dry etching.

Then, polysilicon to which n-type impurity has been implanted is deposited entirely over the lower interlayer insulating film 103 by CVD. The polysilicon is then etched back by dry etching to thereby form the polysilicon plugs 106 in the contact holes 105.

Figure 6:
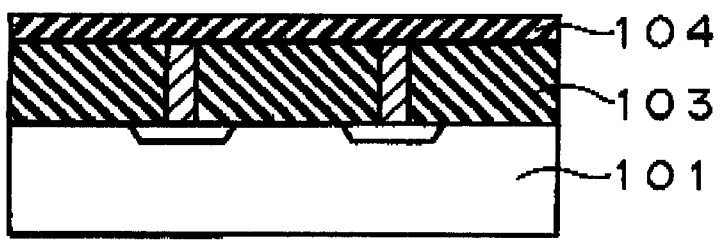

Then, as illustrated in FIG. 6, the silicon nitride film 104 is deposited on the lower interlayer insulating film 103.

Figure 7:
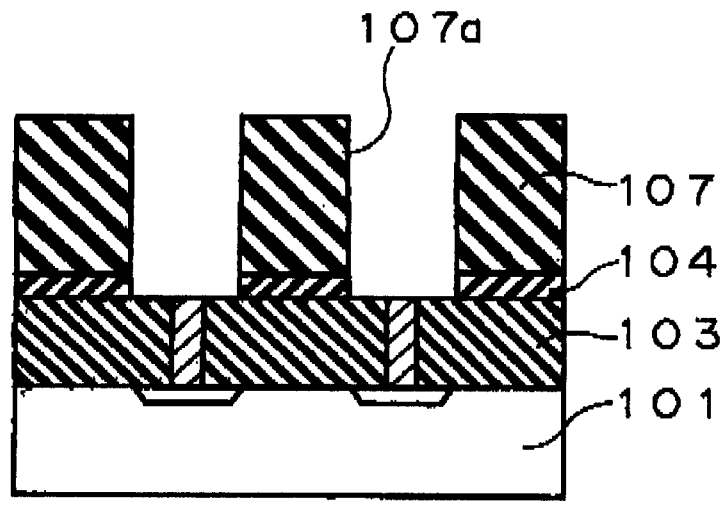

Then, as illustrated in FIG. 7, an oxide film 107 is deposited on the silicon nitride film 104, for instance, by CVD. Then, openings 107a are formed throughout the oxide film 107 by photolithography and dry etching so that the polysilicon plugs 106 are exposed outside. Hereinafter, the oxide film is used as a spacer oxide film 107.

Figure 8:
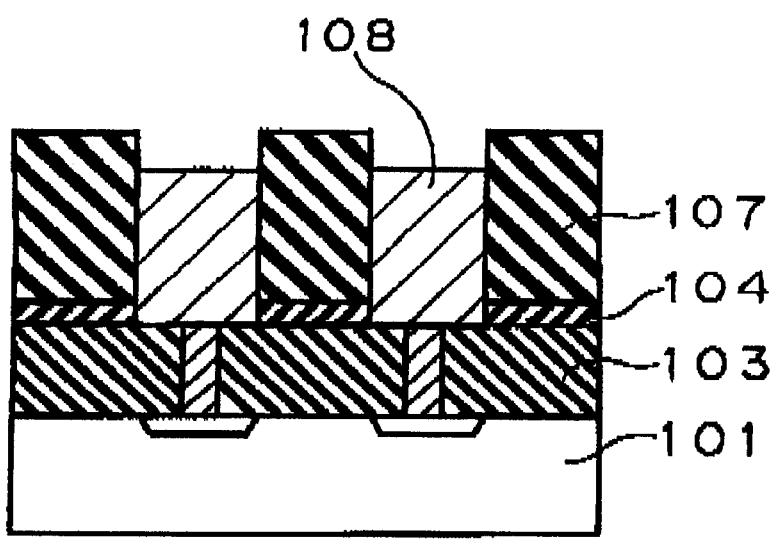

Then, as illustrated in FIG. 8, the openings 107a are entirely filled with polysilicon to which n-type impurity has been implanted. The polysilicon is then etched back by dry etching so that an upper surface of the polysilicon is located lower than an upper surface of the spacer oxide film 107. Thus, there is formed polysilicon 108 as illustrated in FIG. 8.

Figure 9:
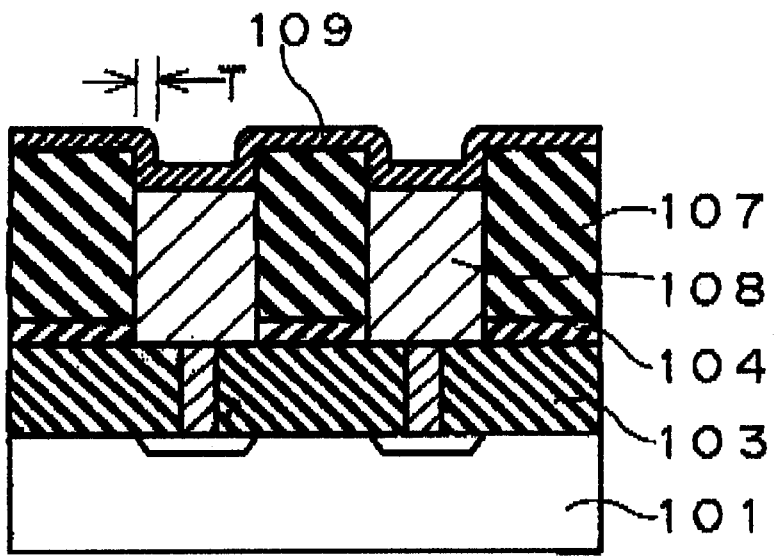

Then, as illustrated in FIG. 9, the spacer oxide film 107 and the polysilicon 108 are entirely covered with a silicon dioxide film 109, for instance, by CVD. A thickness of a sidewall of a later formed cylindrical accumulation electrode is dependent on a thickness T of a portion of the silicon dioxide film 109 formed on an inner surface of the spacer oxide film 107. Hence, a thickness of the silicon dioxide film 109 is determined so that the thickness T is equal to a desired thickness.

Figure 10:
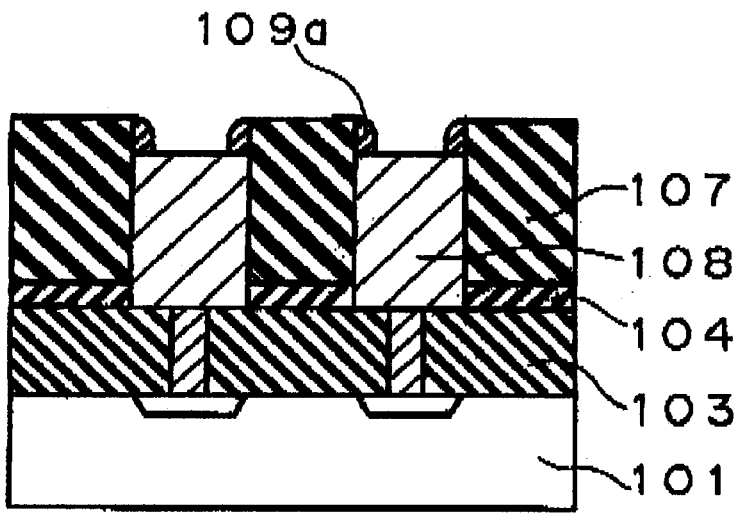

Then, as illustrated in FIG. 10, the silicon dioxide film 109 is etched back for removal by dry etching so that only a portion of the silicon dioxide film 109 remains unetched on an inner surface of the spacer oxide film 107.

Figure 11:
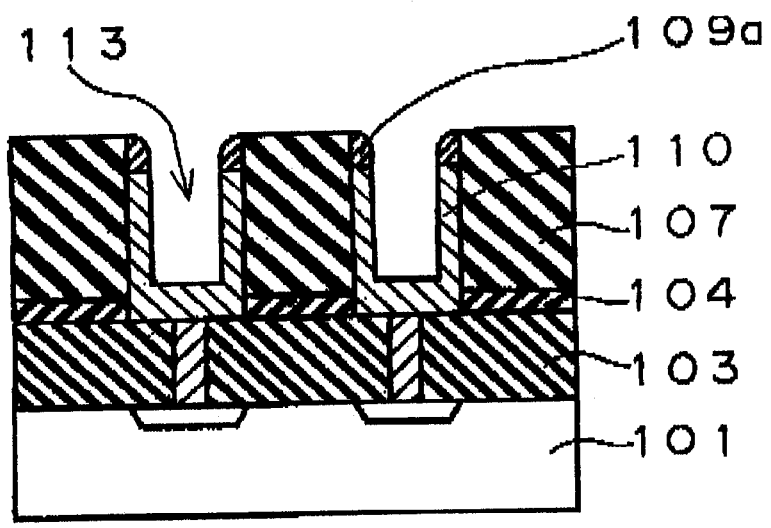

The polysilicon 108 is anisotropically etched by dry etching with the thus patterned silicon dioxide film 109a being used as a mask, to thereby form openings 113 in the polysilicon 108, as illustrated in FIG. 11. As a result, there is formed a cylinder having an almost perpendicularly standing sidewall. When anisotropic etching is carried out to the polysilicon 108, a period of time for anisotropic etching is determined so that a thickness "d" (see FIG. 12) of a bottom of the cylindrical accumulation electrode 110 is greater than a thickness "t" (see FIG. 12) of a sidewall of the cylindrical accumulation electrode 110.

Then, the space oxide film 107 and the silicon dioxide film 109a are etched for removal, for instance, by a solution such as weak hydrofluoric acid. Thus, as illustrated in FIG. 12, there is formed the cylindrical accumulation electrode 110. In the cylindrical accumulation electrode 110, the thickness "d"" of the bottom is greater than the thickness "t" of the sidewall.

Figure 13:
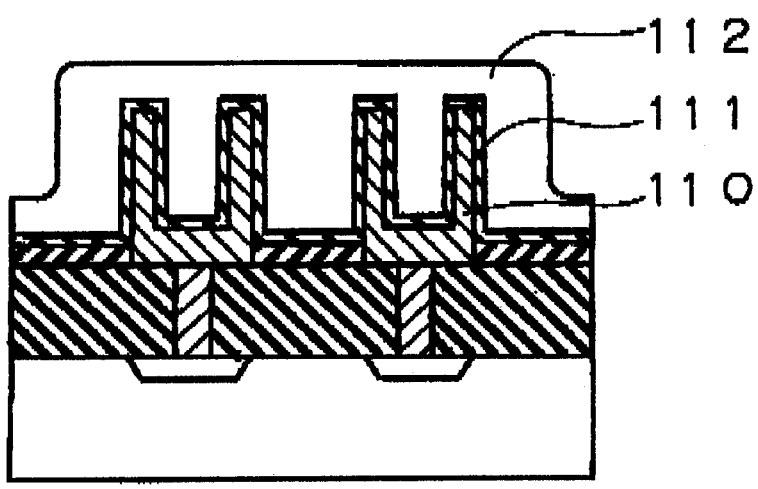

Then, the thus formed cylindrical accumulation electrode 110 is nitrified by lamp annealing. Then, a silicon nitride film is deposited over the cylindrical accumulation electrodes 110 and the silicon nitride film 104 by CVD, and is thermally oxidized. As a result, as illustrated in FIG. 13, a capacity insulating film 111 comprised of the silicon nitride film and an oxide film is formed around the cylindrical accumulation electrodes 110 and over the silicon nitride film 104.

Then, polysilicon to which n-type impurity has been implanted is made grown entirely over the capacity insulating film 111. Thus, there is formed a capacity plate 112 around the cylindrical accumulation electrodes 110, as illustrated in FIG. 13.

A capacitor in the semiconductor memory device is defined by the cylindrical accumulation electrode 110, the capacity insulating film 111, and the capacity plate 112.

In accordance with the above-mentioned method of fabricating semiconductor memory device, the thickness "t" of the sidewall of the cylindrical accumulation electrode 110 is dependent only on the thickness T (see FIG. 9) of the insulating film 109a remaining on an inner surface of the space oxide film 107. The thickness "d" of the bottom of the cylindrical accumulation electrode 110 is dependent on conditions for etching the polysilicon 108, for instance, a period of time for etching.

In a conventional method of fabricating a cylindrical accumulation electrode, since a sidewall and a bottom of a cylindrical accumulation electrode are formed in a common step, thicknesses of them are dependent only on conditions for etching. Accordingly, thicknesses of a sidewall and a bottom of a conventional cylindrical accumulation electrode are always equal to each other.

On the other hand, in the method in accordance with the instant embodiment, since the thickness "t" of the sidewall and the thickness "d" of the bottom are dependent on different factors, the thicknesses "t" and "d" can be determined independently of each other.

As a result, the thickness "d" of the bottom can be designed greater than the thickness "t" of the sidewall. By designing the thickness "d" of the bottom to be greater than the thickness "t" of the sidewall in the cylindrical accumulation electrode 110, it is possible to reduce probability of fall-down of the sidewall, and hence, enhance structural stability of the cylindrical accumulation electrode 110.

Though the capacity insulating film 111 is composed of a nitride film and an oxide film deposited on the nitride film in the above-mentioned embodiment, it should be noted that a film having a high dielectric constant may be used in place of the capacity insulating film 111. For instance, such a film may be composed of tantalum oxide.

Various variants of the above-mentioned embodiment can be made as follows.

When the polysilicon 108 is etched to thereby form openings 113 in the cylinder, the conditions for etching the polysilicon 108 may be determined so that the polysilicon 108 is etched to be tapered. By etching the polysilicon 108 under such conditions, the opening 113 can be tapered, as illustrated in FIG. 14. That is, the resultant cylindrical accumulation electrode 110 has a straight outer surface and a tapered inner surface.

By designing an inner surface of the cylindrical accumulation electrode 110 to be tapered, it is possible to increase an area of a portion through which the sidewall is connected to the bottom, and hence, enhance structural stability of the sidewall of the cylindrical accumulation electrode 110.

Though a degree of an increase in a capacity of the semiconductor memory cell becomes smaller than that of the above-mentioned embodiment, it would be possible to ensure a desired capacity by making the cylindrical accumulation electrode 110 higher.

As illustrated in FIG. 15, the silicon nitride film 104 formed on the lower interlayer insulating film 103 may be all removed by dry etching or by etching through the use of phosphoric acid, to thereby cause an outer surface of the sidewall of cylindrical accumulation electrode 110 entirely exposed.

In comparison with such a structure as illustrated in FIG. 14 in which the insulating film 104 remains on the lower interlayer insulating film 103, it is possible to increase an area of an outer surface of the sidewall, as a capacity film, ensuring an increase in a capacity of the semiconductor memory cell.

In addition, by removing the silicon nitride film 104 through which hydrogen is difficult to pass, the semiconductor memory device illustrated in FIG. 15 provides secondary advantageous effect that hydrogen treatment can be effectively applied to the memory device to remove interfacial level having been generated in etching to be carried out when the memory device is formed, and hence storing characteristic of the memory cell can be enhanced While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 10-164500 filed on Jun. 12, 1998 including specification, claims, drawings and summary is incorporated herein by reference in its entirety.

What is claimed is:

1. A method of fabricating a semiconductor memory device including a memory cell having transistor and a capacitor, and a cylindrical accumulation electrode, said method comprising the steps of:

(a) forming a first insulating film on a lower interlayer insulating film;

(b) forming at least one hole through said first insulating film so that said hole reaches said lower interlayer insulating film;

(c) forming a polysilicon layer in said hole so that an upper surface of said polysilicon layer is located lower than an upper surface of said first insulating film;

(d) covering said first insulating film and said polysilicon layer with a second insulating film;

(e) etching back said second insulating film so that said second insulating film remains only on a sidewall of said first insulating film; and (f) etching said polysilicon layer with said second insulating film being used as a mask so that said polysilicon layer has a thickness different from a thickness of said second insulating film after said polysilicon layer has been etched.

2. The method as set forth in claim 1, wherein said polysilicon layer is etched in said step (f) so that said polysilicon layer has a thickness greater than a thickness of said second insulating film after said polysilicon layer has been etched.

3. The method as set forth in claim 1, wherein said step (c) includes the steps of:

(c1) filling said hole with polysilicon; and (c2) etching back said polysilicon so that an upper surface of said polysilicon is located lower than an upper surface of said first insulating film.

4. The method as set forth in claim 3, wherein time for etching said polysilicon is controlled such that said polysilicon has a thickness greater than a thickness of said second insulating film after said polysilicon has been etched.

5. The method as set forth in claim 3, wherein said polysilicon is etched to have such a taper that a thickness of said polysilicon is greater at a location closer to a bottom thereof.

6. The method as set forth in claim 5, wherein said polysilicon is etched so that said polysilicon has a straight outer surface and a tapered inner surface.

7. The method as set forth in claim 1, further comprising the step of removing said first insulating film so that said lower interlayer insulating film entirely appears.

* * * * *